(12) United States Patent
Sirocka et al.

(10) Patent No.: US 10,818,345 B1
(45) Date of Patent: Oct. 27, 2020

(54) TWO-STAGE SIGNALING FOR VOLTAGE DRIVER COORDINATION IN INTEGRATED CIRCUIT MEMORY DEVICES

(71) Applicant: Micron Technology, Inc., Boise, ID (US)

(72) Inventors: Nathan Joseph Sirocka, Loomis, CA (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/660,486

(22) Filed: Oct. 22, 2019

(51) Int. Cl.
| | |
|---|---|
| *G11C 11/41* | (2006.01) |
| *G11C 11/413* | (2006.01) |
| *G11C 11/4074* | (2006.01) |
| *G11C 29/50* | (2006.01) |
| *G11C 11/408* | (2006.01) |
| *G11C 11/4094* | (2006.01) |
| *G11C 5/14* | (2006.01) |

(52) U.S. Cl.
CPC ........ *G11C 11/413* (2013.01); *G11C 11/4074* (2013.01); *G11C 11/4085* (2013.01); *G11C 11/4094* (2013.01); *G11C 29/50004* (2013.01); *G11C 5/14* (2013.01); *G11C 5/144* (2013.01)

(58) Field of Classification Search
CPC ......... G11C 11/413; G11C 5/14; G11C 5/144; G11C 5/148
See application file for complete search history.

(56) References Cited

U.S. PATENT DOCUMENTS

| | | | |
|---|---|---|---|
| 2004/0027908 A1* | 2/2004 | Ooishi ................ | G11C 7/1039 365/230.03 |
| 2007/0070744 A1* | 3/2007 | Chen ...................... | G11C 8/08 365/203 |

* cited by examiner

*Primary Examiner* — Han Yang
(74) *Attorney, Agent, or Firm* — Greenberg Traurig

(57) ABSTRACT

An integrated circuit memory device, having: memory cells; a circuit patch configured on an integrated circuit die; a plurality of neighboring patches configured on the integrated circuit die; first connections from the circuit patch to the neighboring patches respectively; a plurality of surrounding patches configured on the integrated circuit die; and second connections from the neighboring patches to the surrounding patches. In determining whether or not to apply an offset voltage to be driven by the neighboring patches and the surrounding patches on non-selected memory cells, to at least partially offset a voltage increase applied by the circuit patch on one or more selected memory cells, the circuit patch communicates with the neighboring patches through the first connections, and communicates with the surrounding patches through the first connections, the neighboring patches, and the second connections.

20 Claims, 7 Drawing Sheets

TWO-STAGE SIGNALING FOR VOLTAGE DRIVER COORDINATION IN INTEGRATED CIRCUIT MEMORY DEVICES

FIELD OF THE TECHNOLOGY

At least some embodiments disclosed herein relate to voltage driver operations of integrated circuit memory devices in general and more particularly but not limited to signaling in support of coordination among voltage drivers.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide a two-stage signal routing technique for voltage driver operations in integrated circuit memory.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device when the memory cell is in a conductive state. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed, the memory cell has a threshold lower than the cell that has been reset/programmed to have high threshold, such that during a read operation, the read voltage can cause a programmed cell to become conductive while a reset cell remains non-conductive.

Figure 1:
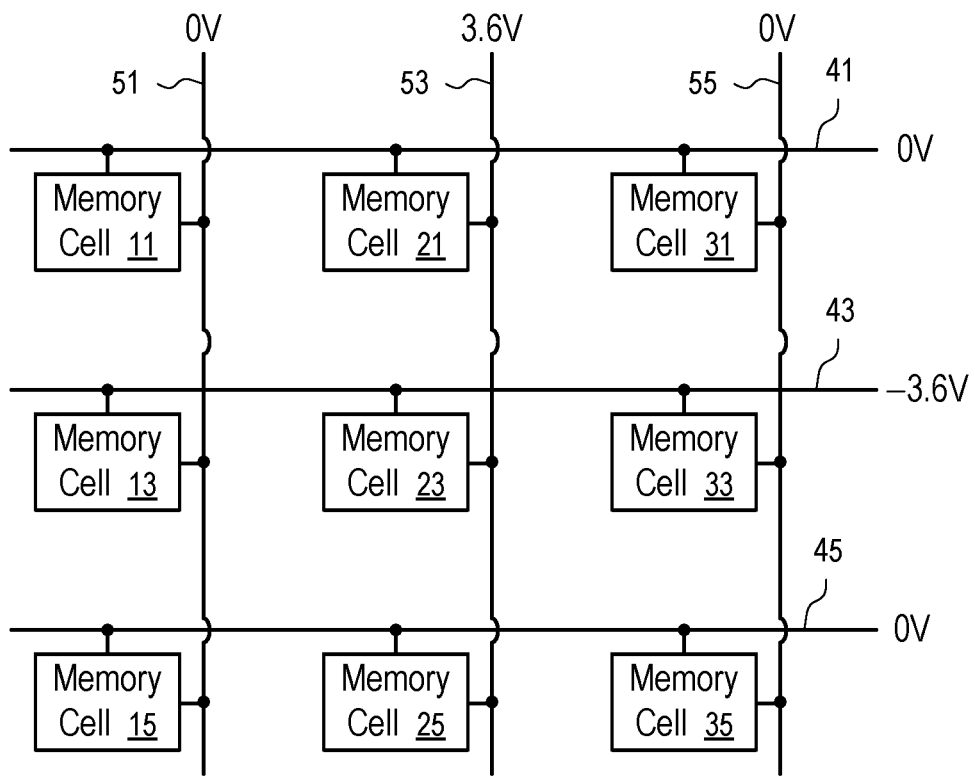
FIGS. 1 and 2 show applications of voltages during a write operation to place selected memory cells in a conductive state for programming according to one embodiment.
Figure 2:
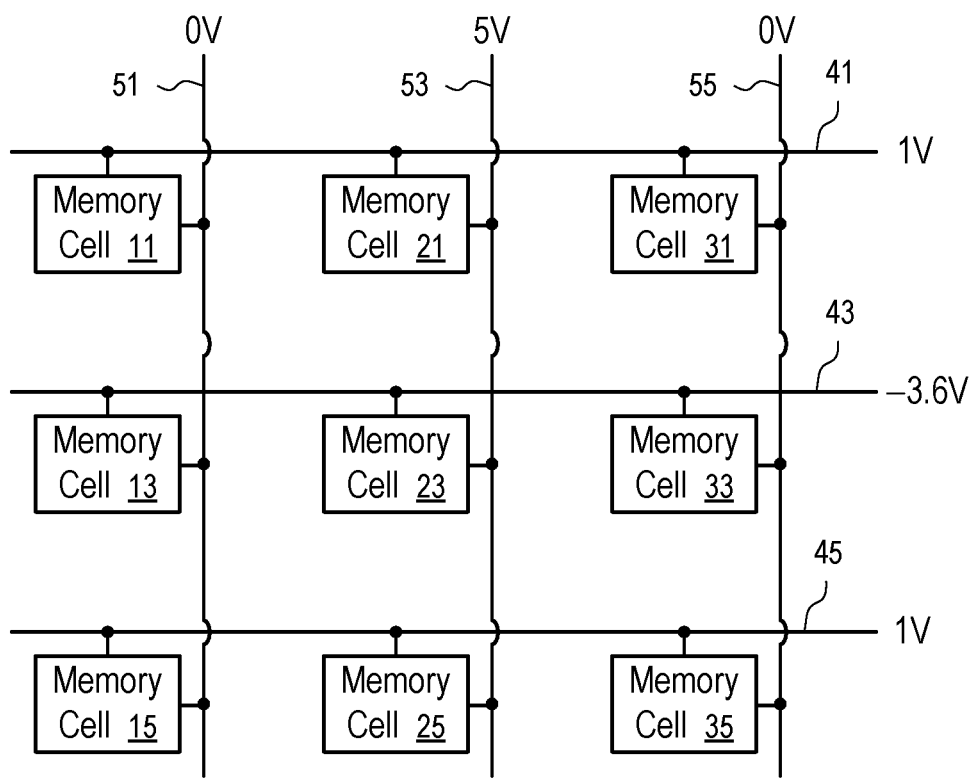

FIGS. 1 and 2 show applications of voltages during a write operation to place selected memory cells in a conductive state for programming according to one embodiment.

FIGS. 1 and 2 illustrate an array of memory cells (e.g., 11, 13, 15; 21, 23, 25; 31, 33, 35) connected to bitlines (e.g., 51, 53, 55) and wordlines (e.g., 41, 43, 45). A bitline (e.g., 53) drives multiple memory cells (e.g., 21, 23, 25); and a wordline (e.g., 43) drives multiple memory cells (e.g., 13, 23, 33). Each memory cell (e.g., 23) is connected to one of the bitlines (e.g., 53) and one of the wordlines (e.g., 43). A voltage difference applied on the memory cell (e.g., 23) is the difference between the voltages on the bitline (e.g., 53) and the wordline (e.g., 43) connected to the memory cell (e.g., 23). When the voltage difference applied on a memory cell (e.g., 23) is above the current voltage threshold of the memory cell (e.g., 23), the memory cell (e.g., 23) becomes conductive; and when the voltage difference applied on a memory cell (e.g., 23) is below the current voltage threshold of the memory cell (e.g., 23), the memory cell (e.g., 23) remains non-conductive.

During a write operation, voltage drivers can be used to apply selection and de-selection voltages on bitlines (e.g., 51, 52, 53) and wordlines (e.g., 41, 43, 45) to place a selected memory cell (e.g., 23) in a conductive state. Once the selected memory cell (e.g., 23) is in the conductive state, programming pulses can be applied to the memory cell (e.g., 23) to adjust its voltage threshold according to the data to be stored by the memory cell (e.g., 23). When a memory cell (e.g., 13, 21, or 35) connected to a bitline and a wordline is not to be selected for the write operation, the voltage difference between the bitline and the wordline of the corresponding memory cell is configured to be less than a voltage limit (e.g., 4V or 4.5V) that can be configured to be lower than the voltage thresholds in the memory cells in the array; and when a memory cell (e.g., 23) is selected for the write operation, the voltage difference between the bitline (e.g., 53) and the wordline (43) is ramped up over the voltage limit (e.g., 4V or 4.5) and up to a voltage difference (e.g., up to 8.6V) that can place the memory cell (e.g., 23) in a conductive state. A two-stage technique of ramping up voltages to place a selected memory cell in a conductive state during a write operation can be used to reduce power consumption.

FIG. 1 shows a first stage of ramping up voltages during a write operation. In FIG. 1, the bitline (53) and the wordline (43) connected to a memory cell (23) selected for read are driven up to first voltages (e.g., 3.6V and −3.6V respectively). The first voltages have opposite sign. The magnitude (s) of the first voltages (e.g., 3.6V) can be configured to be smaller than the voltage limit (e.g., 4V or 4.5V) for write selection. At the same time, bitlines (e.g., 51 and 55) and wordlines (e.g., 41 and 45) that are not connected to a selected memory cell (e.g., 23) can be held ground (e.g., 0V).

In the example of FIG. 1, the bitline (53) and the wordline (43) of a memory cell (23) selected for the write operation are driven up to 3.6V and −3.6V respectively. Thus, the selected memory cell (23) is subjected up to 7.2V of voltage difference between its bitline (53) and wordline (43), which is significantly higher than the voltage limit (e.g., 4V or 4.5V) for write selection. The non-selected memory cells (11, 31, 15 and 35) that are not connected to any of the bitline (53) and the wordline (43) of the selected memory cell (23) are subjected to a voltage difference of zero; and the non-selected memory cells (21, 25, 13 and 33) that are connected to any of the bitline (53) and the wordline (43) of the selected memory cell (23) are subjected to a voltage difference that is up to 3.6V, which is lower than the voltage limit (e.g., 4V or 4.5V) for write selection.

In general, some memory cells in an integrated circuit memory device have threshold voltages lower than the maxim voltage difference (e.g., 7.2V) that can be applied in the first stage of ramping up voltages; and other memory cells have threshold voltages (e.g., between 7.2V and 8.6V) that are higher than the maxim voltage difference (e.g., 7.2V) of the first stage. When the voltages driven upon memory cells selected for the write operation reach their threshold voltages, the selected memory cells become conductive and ready for programming pulses; and thus, it is not necessary to further ramping up the voltages for the selected memory cells.

However, when a memory cell (e.g., 23) selected for the write operation has a threshold voltage (e.g., between 7.2V and 8.6V) that is higher than the maxim voltage difference (e.g., 7.2) that can be applied in the first stage of ramping up voltages, the voltage difference applied on the memory cell (e.g., 23) is to be further increased in a way as illustrated in FIG. 2, to place the memory cell (e.g., 23) in a conductive state.

FIG. 2 shows a second stage of the write operation. In FIG. 2, the bitline (53) of the selected memory cell (23) is further driven up to 5V, while the wordline (43) of the selected cell (23) is held at −3.6V. Thus, the voltage difference applied on the memory selected cell (23) with a high threshold voltage is driven up to 8.6V to place the memory cell (23) in a conductive state.

However, driving up the bitline (53) to 5V can potentially increase the voltage difference applied on non-selected memory cells (e.g., 21 and 25) to above the voltage limit (e.g., 4V or 4.5V) that is configured to prevent a non-selected, low threshold memory cell from becoming conductive during the write operation. To keep the voltage difference applied on the non-selected memory cells (e.g., 21 and 25) under the voltage limit (e.g., 4.5V), the voltage drivers of the relevant wordlines (e.g., 41 and 45) can be instructed to drive an offset voltage (e.g., to 1V or 1.2V) to at least partially offset the increased voltage applied on the bitline (53) of the selected memory cell (23) that does not become conductive during the first stage of ramping up voltages for the write operation.

Figure 7:
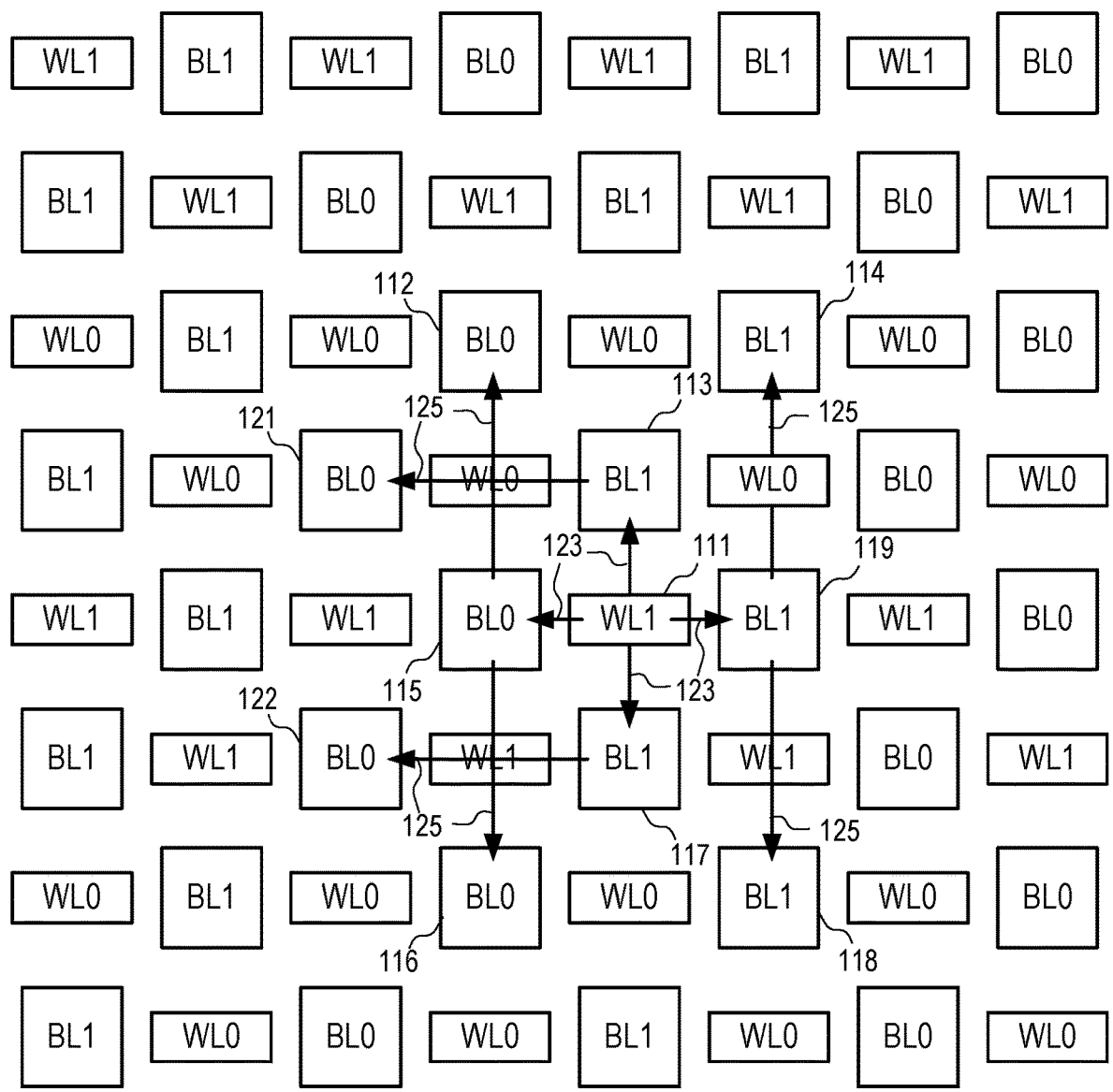
Figure 8:
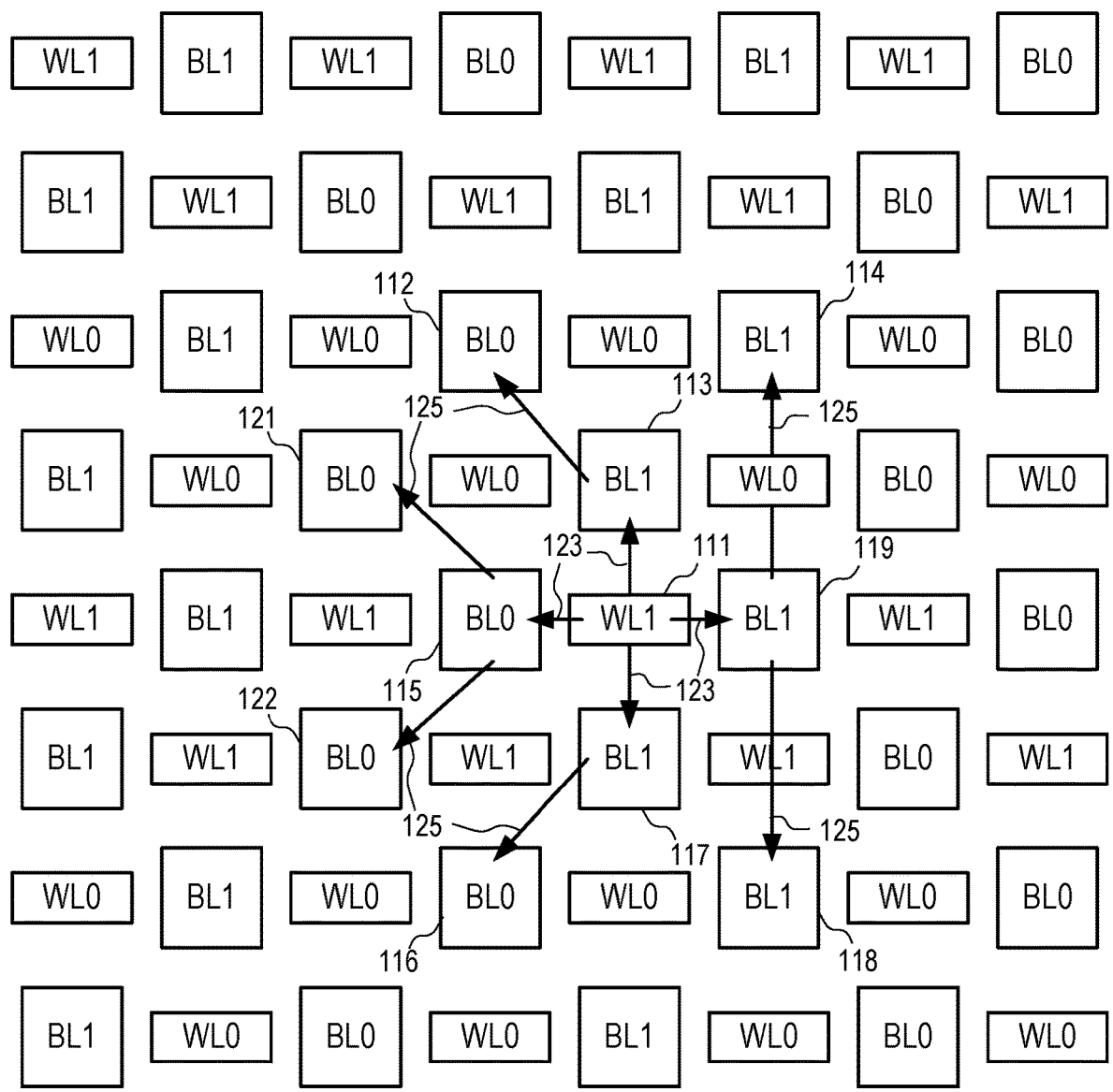
Figure 9:
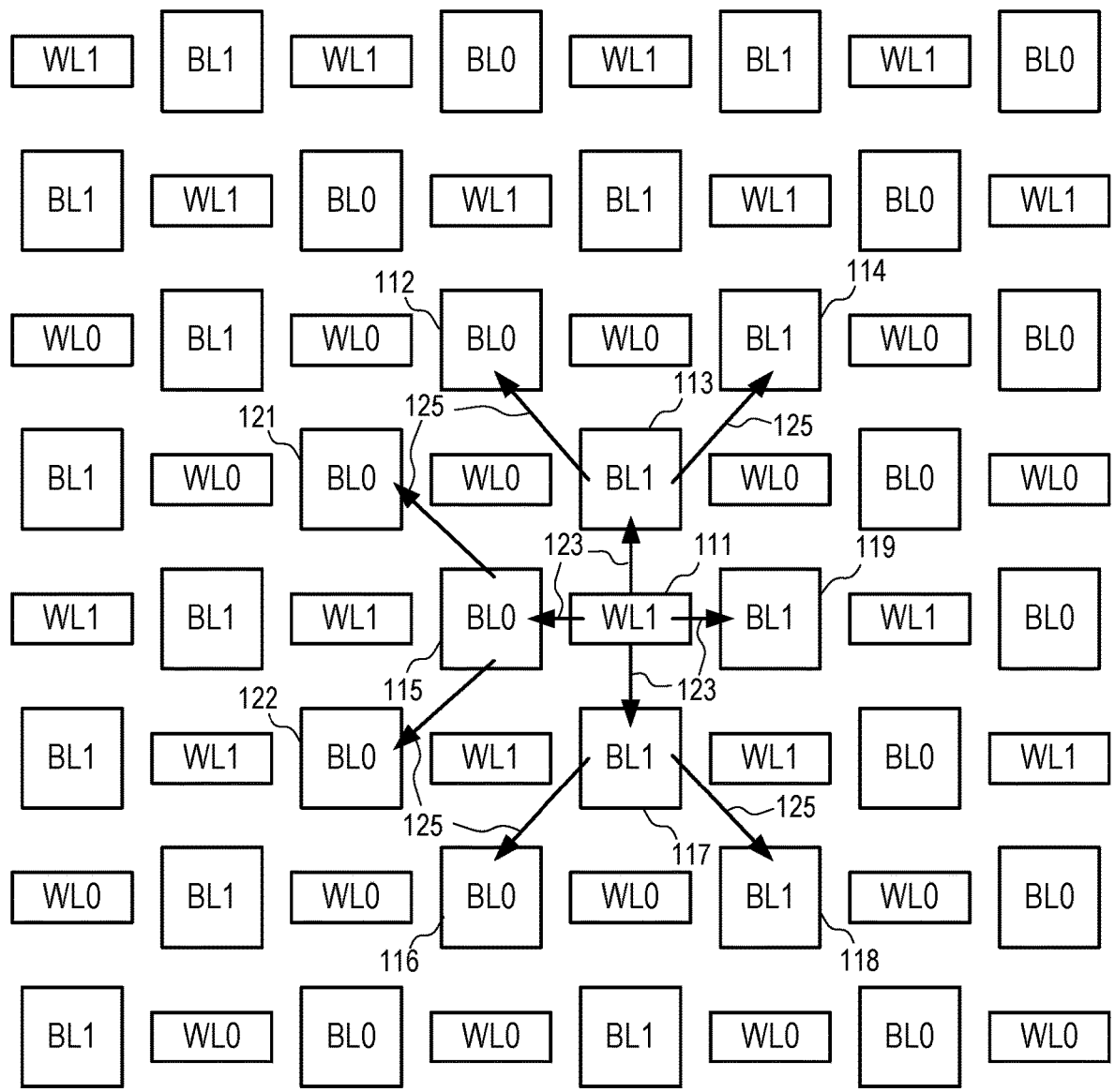

Voltage drivers can be configured in circuit patches on the integrated circuit die. For example, voltage drivers for driving bitlines can be configured in bitline patches; and voltage drivers for driving wordlines can be configured in wordline patches. The bitline patches and wordline patches can be interleaved in a grid (e.g., as illustrated in FIGS. 7-9).

Circuit patches can be configured to communicate with each other using a signal network in determining whether a circuit patch is to apply the offset voltage (e.g., 1V on non-selected wordlines (41 and 35)) during the second stage of ramping voltage for the write operation, to offset at least in part the increased voltage on non-selected memory cells (e.g., 21 and 25) due to the increased voltage (e.g., applied on the bitline (53)) on a selected cell (e.g., 23). The signal network can be implemented using a two-stage signaling technique discussed herein to reduce diffusion area and routing.

Figure 3:
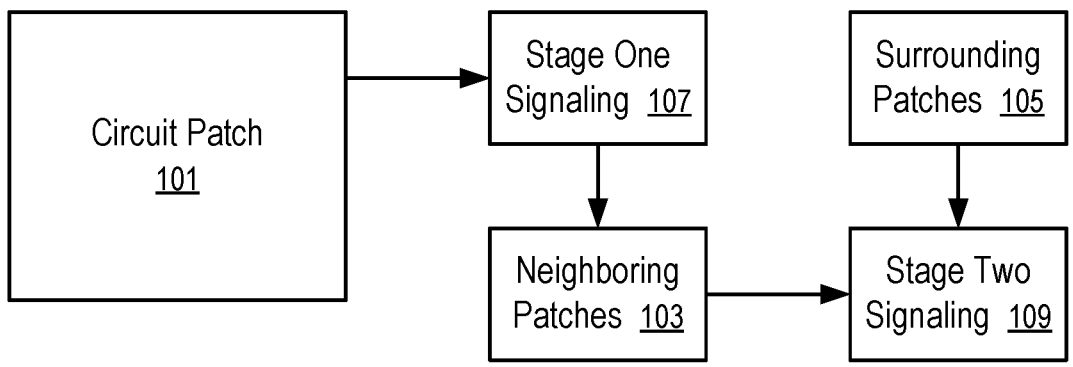
FIG. 3 shows a two-stage signaling technique in an integrated circuit memory device according to one embodiment.

FIG. 3 shows a two-stage signaling technique in an integrated circuit memory device according to one embodiment.

In FIG. 3, a circuit patch (101) has voltage drivers. When an increased voltage is to be applied by the circuit patch (101) in the second stage of ramping up voltages for a write operation, connections between the circuit patch (101) and its neighboring patches (103) are used for the stage one signaling (107), which causes the neighboring patches (103) to drive the offset voltage(s) for non-selected memory cells and thus to at least partially offset the increased voltage applied by the circuit patch (101) on the non-selected memory cells (e.g., 21 and 25 as illustrated in FIGS. 1 and 2) that are driven in part by the neighboring patches (103).

The neighboring patches (103) have connections to surrounding patches (105) of the neighboring patches for the stage two signaling (109) among the neighboring patches (103) and the surrounding patches (105). When the increased voltage is applied by the circuit patch (101) in the second stage of ramping up voltages for the write operation, the stage two signaling (109) causes the surrounding patches (105) to drive up the offset voltage(s) for non-selected memory cells and thus at least partially offset the increased voltage applied by the circuit patch (101) on non-selected memory cells (e.g., 21 and 25 as illustrated in FIGS. 1 and 2) that are driven in part by the surrounding patches (105).

The neighboring patches (103) can be configured as the closest patches to the circuit patch (101); the surrounding patches (105) are of the same type as the neighboring patches (103); and the surrounding patches (105) are the second closest to the circuit patch (101) and the closest to the neighboring patches (103).

In some instances, a circuit patch (e.g., 101) be configured to control half of a neighboring, or a surrounding patch, in applying the offset voltage.

Figure 4:
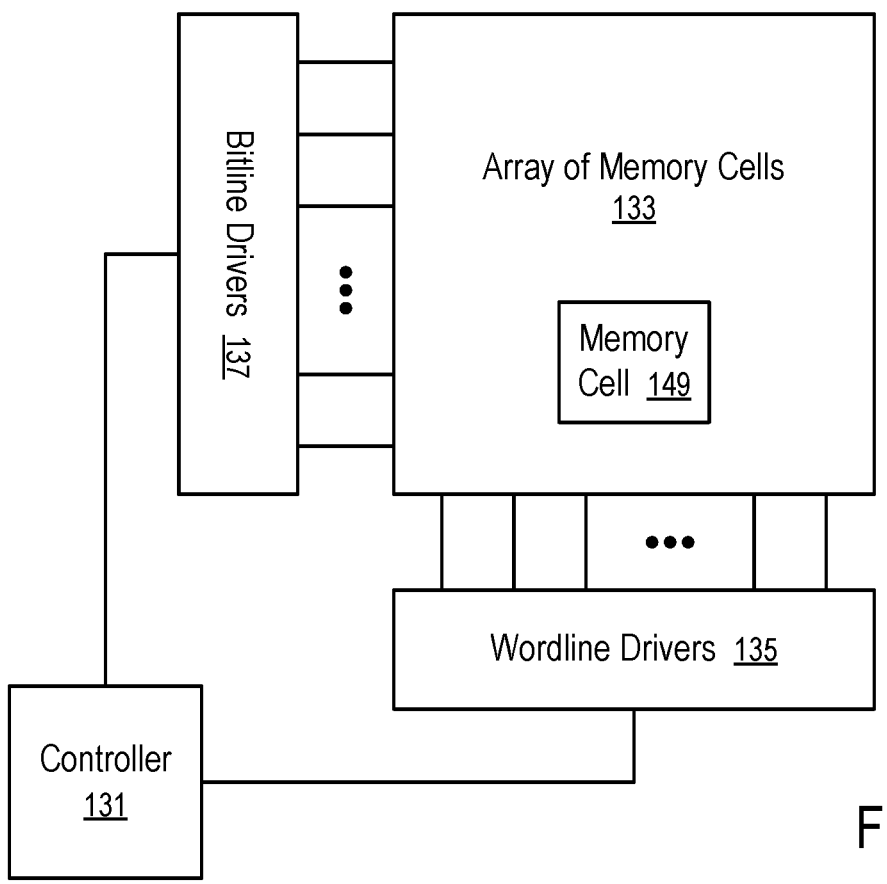
FIG. 4 shows a memory device configured with a two-stage signaling scheme according to one embodiment.

FIG. 4 shows a memory device configured with a two-stage signaling scheme according to one embodiment.

In FIG. 4, the memory device includes an array (133) of memory cells (e.g., 149). For example, a typical memory cell (e.g., 149) in the array (133) can have a select device and no phase-change memory device; the voltage threshold of the memory cell (149) is programmable to store data via applying pulses with opposite polarity when the memory cell (149) is in a conductive stage; and during an operation to read the memory cell, voltages of a predetermined, fixed polarity are applied on the memory cell to test the level of the voltage threshold.

The memory device of FIG. 4 includes a controller (131) that operates bitline drivers (137) and wordline drivers (135) to access the individual memory cells (e.g., 149) in the array (133).

To determine whether an offset voltage (e.g., 1V in FIG. 2 on non-selected wordlines (41 and 45)) is to be applied for the memory cell (149), a two-stage signaling technique of FIG. 3 can be used.

For example, the bitline drivers (137) and/or the wordline drivers (135) can use a two-stage signaling techniques of FIG. 3 in determining whether an offset voltage (e.g., 1V in FIG. 2) is to be applied by voltage drives in a circuit patch on non-selected wordlines or bitlines of memory cells that are also connected to wordlines or bitlines of selected memory cells, in view of the increased voltages (e.g., 5V) applied on the selected memory cells during the second stage of ramping up voltages for the write operation, as illustrated in FIG. 2.

Figure 5:
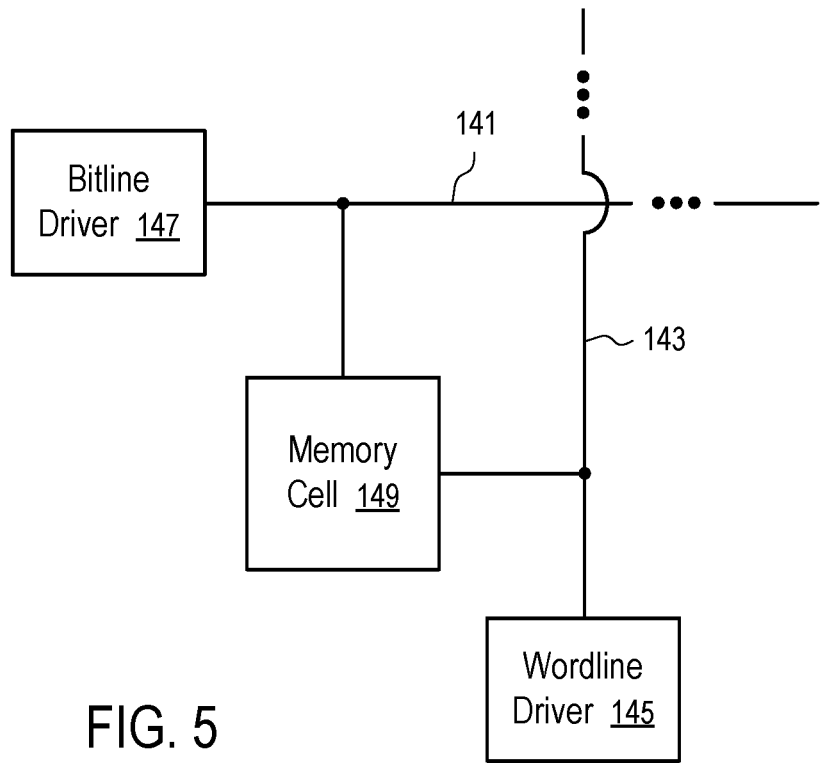
FIG. 5 shows a memory cell with a bitline driver and a wordline driver according to one embodiment.

Each memory cell (e.g., 149) in the array (133) can be driven by a pair of a bitline driver and a wordline driver, as illustrated in FIG. 5.

FIG. 5 shows a memory cell with a bitline driver (147) and a wordline driver (145) according to one embodiment.

For example, the bitline driver (147) drives on a bitline wire (141) a first voltage applied to a row of memory cells in the array (133); and the wordline driver (145) drives on a wordline wire (143) a second voltage applied to a column of memory cells in the array (133). A memory cell (149) in the row and column of the memory cell array (133) is subjected to the voltage difference between the first voltage driven by the bitline driver (147) and the second voltage driven by the wordline driver (145). When the first voltage is higher than the second voltage, the memory cell (149) is subjected to one voltage polarity (e.g., positive polarity); and when the first voltage is lower than the second voltage, the memory cell (149) is subjected to an opposite voltage polarity (e.g., negative polarity).

For example, when the memory cell (149) is to be selected, the bitline driver (147) drives a positive high voltage (e.g., 4V) in one polarity and a negative high voltage (e.g., −4V) in the opposite polarity. Similarly, the wordline driver (145) drives a negative high voltage (e.g., −4V) in one polarity and a positive high voltage (e.g., 4V) in the opposite polarity.

For example, when the memory cell (149) is to be de-selected, the bitline driver (147) drives a low voltage (e.g., 0V) in one polarity and a low voltage (e.g., 0V) in the opposite polarity. When the bitline driver (147) drives a low voltage, the wordline driver (145) may drive a high voltage, or drive a low voltage.

Similarly, when the memory cell (149) is to be de-selected, the wordline driver (145) drives a low voltage (e.g., 0V) in one polarity and a low voltage (e.g., 0V) in the opposite polarity. When the wordline driver (145) drives a low voltage, the bitline driver (147) may drive a high voltage, or drive a low voltage.

For example, the bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 101) in the array (133) is formed at a cross point of the two wires (e.g., 141 and 143) in the integrated circuit die of the cross point memory.

At least one of the bitline driver (147) and the wordline driver (145) can configured to use a two-stage signaling technique of FIG. 3 to determine whether to apply an offset voltage (e.g., 1V in FIG. 2) on a non-selected line in the second stage of ramping up voltages for the write operation illustrated in FIG. 2.

FIGS. 6-9 illustrate examples of two-stage signaling among circuit patches in integrated circuit memory devices according to one embodiment.

Figure 6:
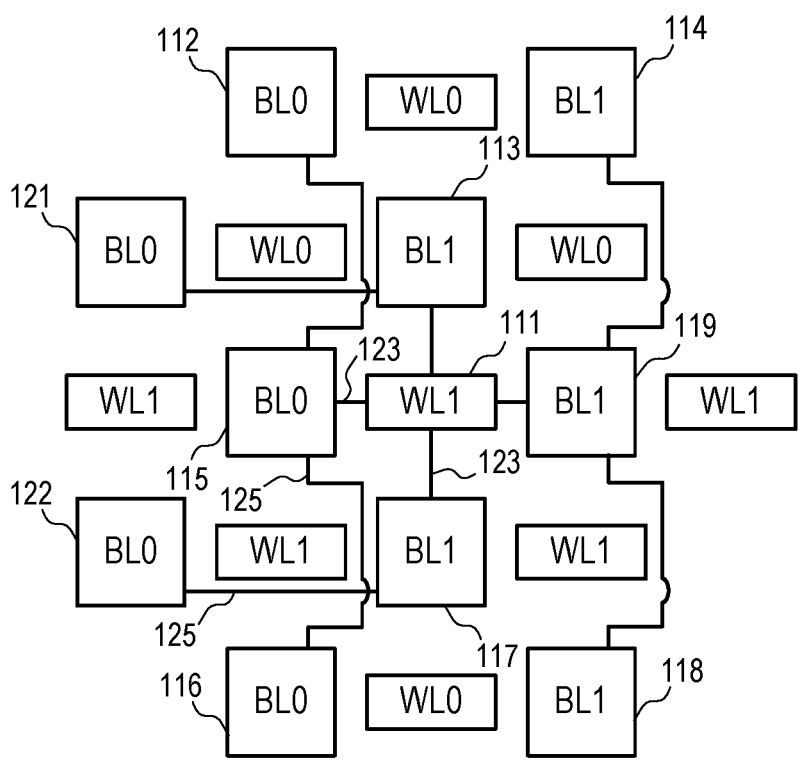
FIGS. 6-9 illustrate examples of two-stage signaling among circuit patches in integrated circuit memory devices according to one embodiment.

In FIG. 6, a wordline patch (111) can further ramp up a voltage on a wordline during the second stage of the write operation for a selected memory cell and communicate with neighboring bitline patches (113, 115, 117, 119) and surrounding bitline patches (112, 114, 116, 118, 121, and 122) to cause them to drive the offset voltage on non-selected bitlines.

With stage one signaling (107), the wordline patch (111) communicates with the neighboring bitline patches (113, 115, 117, 119) to determine whether to drive the offset voltage by the voltage drivers in the bitline patches (113, 115, 117, 119) on non-selected bitlines.

The stage one signaling (107) can be performed using the direct connections (123) between the wordline patch (111) and the neighboring bitline patches (113, 115, 117, 119).

Further, with stage two signaling (109), the wordline patch (111) communicates with the surrounding bitline patches (112, 114, 116, 118, 121, and 122) via the neighboring bitline patches (113, 115, 117, 119), in determining whether to drive the offset voltage by the voltage drivers in the surrounding bitline patches (112, 114, 116, 118, 121, and 122) on non-selected bitlines.

The stage two signaling (109) can be performed using the direct connections (123) between the wordline patch (111)

and the neighboring bitline patches (113, 115, 117, 119) and the direct connections between the neighboring bitline patches (113, 115, 117, 119) and the surrounding bitline patches (112, 114, 116, 118, 121, and 122).

The two-stage signaling technique avoids the direct connections from the wordline patch (111) to the surrounding bitline patches (112, 114, 116, 118, 121, and 122).

FIG. 7 illustrates the grid arrangement of wordline patches and bitline patches.

In FIG. 7, bitline patches are interleaved into each row of wordline patches (e.g., WL0 or WL1). Similarly, wordline patches are interleaved into each column of bitline patches (e.g., BL0 or BL1). Two neighboring columns of bitline patches (e.g., BL1 or BL0) are combined as a service column for a bitline; and two neighboring rows of wordline patches (e.g., WL1 or WL0) are combined to a service row for a wordline.

In FIG. 7, the immediate neighbors (113, 115, 117, 119) of a wordline patch (111) are bitline patches. In the grid arrangement of FIG. 7, the neighboring patches (113 and 117) are located in the same column as the wordline patch (111) and in the rows immediately above and below the row of the wordline (111). The neighboring patches (115 and 119) are located in the same row as the wordline patch (111) and in the columns immediately to the left and right of the column of wordline (111). Thus, the neighboring patches (113, 115, 117, and 119) are the bitline patches that are closest to the wordline patch (111).

In FIG. 7, the surrounding neighbors (112, 114, 116, 118, 121, 122) are bitline patches that are closest to and that are connected to the immediate neighbors (113, 115, 117, 119). Each of the immediate neighbors (113, 115, 117, 119) is connected to one or two of the surrounding neighbors (112, 114, 116, 118, 121, 122).

For example, the upper and lower neighbors (113 and 117) of the wordline patch (111) are configured/wired to facilitate the communication between the wordline patch (111) and the surrounding patches (121 and 122) that are located in the same rows as the upper and lower neighbors (113 and 117) and in the second column to the left of the column of the wordline (111).

For example, the left and right neighbors (115 and 119) of the wordline patch (111) are configured/wired to facilitate the communication between the wordline patch (111) and the surrounding patches (112, 116; and 114, 118) that are located in the same columns as the left and right neighbors (115 and 119) and in the second rows to the up and down sides of the row of the wordline (111).

FIG. 8 illustrates a configuration where the neighboring bitline patches (113, 115 and 117) are configured to communicate with their diagonal up and down neighbors (112, 121, 122, 116) are that to their left. The routing from the neighboring bitline patches (113, 115 and 117) to the surrounding bitline patches (112, 121, 122, 116) are to the next row and column, but not across a column or row.

FIG. 9 illustrates a configuration where the surrounding patches (114 and 118) are connected to the neighboring patches (113 and 117) also via diagonal connections to avoid routing across a column or row.

In general, offset voltages can be driven by voltage drivers configured in wordline patches and/or bitline patches.

Figure 10:
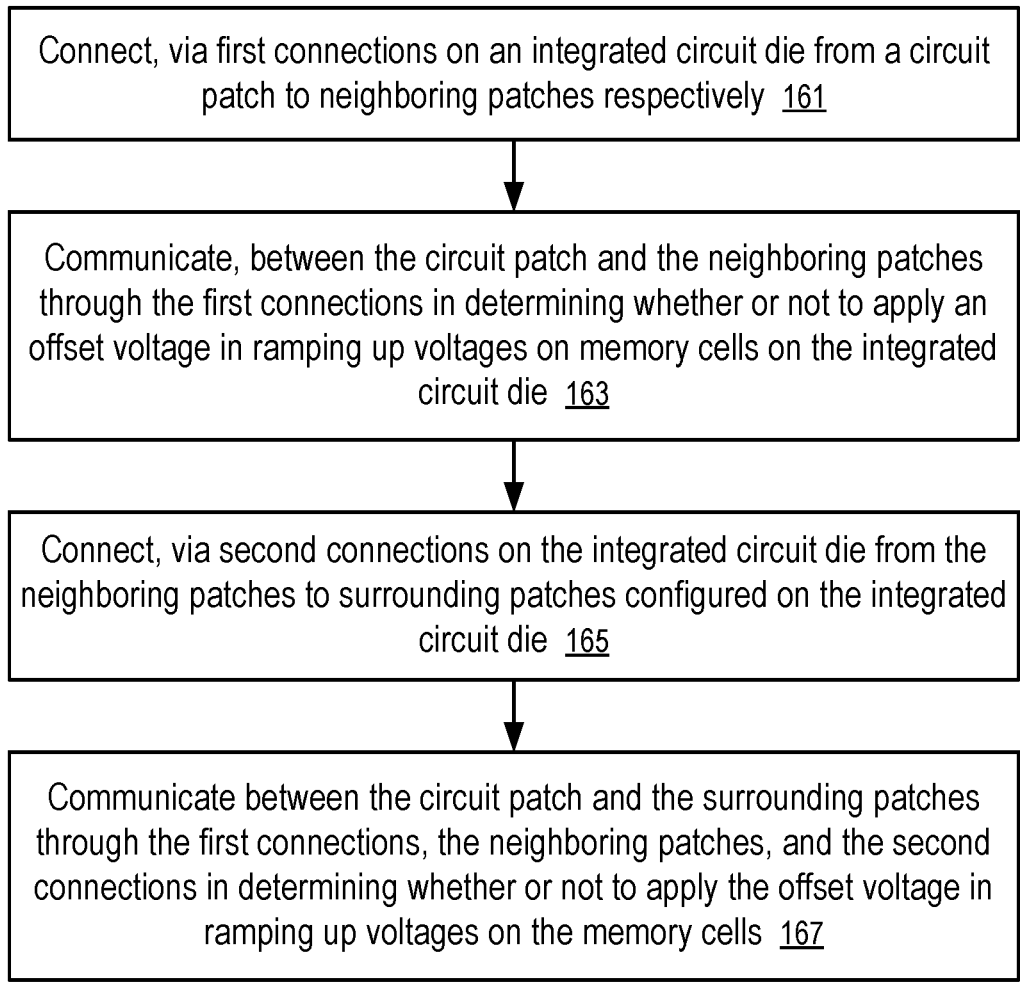
FIG. 10 shows a method of two-stage signaling in an integrated circuit memory device according to one embodiment.

FIG. 10 shows a method of two-stage signaling in an integrated circuit memory device according to one embodiment. For example, the method of FIG. 10 can be implemented using the two-stage signaling techniques of FIGS. 1-9.

At block 161, an integrated circuit memory device connects, via first connections (123) on an integrated circuit die from a circuit patch (e.g., 102 or 111) to neighboring patches (e.g. 103; or 113, 115, 117, 119), respectively.

At block 163, the circuit patch (e.g., 102 or 111) and the neighboring patches (e.g. 103; or 113, 115, 117, 119) communicate (e.g., 107) through the first connections (123) in determining whether or not to apply an offset voltage (e.g., 1V on lines 41 and 45 illustrated in FIG. 2) in ramping up voltages on memory cells (e.g., 149) on the integrated circuit die.

The offset voltage is applied on memory cells that are not selected for a write operation. The offset voltage is configured to cancel out, or offset, at least in part the increase on voltages applied on lines connected to memory cells that are selected for the write operations, such that the voltage differences applied on the non-selected memory cells do not exceed a voltage limit (e.g., 4V, or 4.5V) for write selection.

For example, a typical memory cell (149) in the array (133) of cross point memory can have a select device and no phase-change memory device.

For example, the offset voltage can be configured to be driven by some wordline patches and/or some bitline patches in an integrated circuit die.

For example, the circuit patch (101) can be of a first type; the neighboring patches (103) and the surrounding patches (105) can be of a second type; and the first and second types are different ones of wordline patch and bitline patch. In a grid array of circuit patches, no patches of the second type are closer to the circuit patch (e.g., 101; or 111) than the surrounding patches (e.g., 105; or 112, 114, 116, 118, 121, 122).

Optionally, the circuit patch (101) can instruction a half of a neighboring patch or surrounding patch to apply the offset voltage, but not the other half.

At block 165, an integrated circuit memory device connects, via second connections (125) on the integrated circuit die from the neighboring patches (e.g. 103; or 113, 115, 117, 119) to surrounding patches (e.g., 105; or 112, 114, 116, 118, 121, 122) configured on the integrated circuit die.

At block 167, the circuit patch (e.g., 102 or 111) and the surrounding patches (e.g., 105; or 112, 114, 116, 118, 121, 122) communicate through the first connections (123), the neighboring patches (e.g. 103; or 113, 115, 117, 119)), and the second connections (125) in determining whether or not to apply the offset voltage in ramping up voltages on the memory cells.

For example, a connection (123) to a neighboring patch (e.g., 115) is used by the circuit patch (e., 111) to communicate with not only the neighboring patch (e.g., 115), but also a surrounding patch (e.g., 112 or 116 in FIG. 7; 121 or 122 in FIGS. 6-9).

For example, during a first stage of ramping up voltages for a write operation to place selected memory cells in a conductive state, the bitline drivers (137) and wordline drivers (135) can ramp up voltages on selected bitlines (e.g., 141) in the integrated circuit die to a first predetermined voltage of a first polarity (e.g., 3.6V) and ramp up voltages on selected wordlines (e.g., 143) in the integrated circuit die to the first predetermined voltage of a second polarity (e.g., −3.6V) that is opposite to the first polarity, while holding non-selected bitlines and wordlines to a second voltage (e.g., 0V). The circuit patches then determine whether the selected memory cells become conductive under the voltages ramped up during the first stage of the write operation. A selected memory cell is connected to a selected wordline and a selected bitline; and a non-selected memory cell is connected to a non-selected wordline and/or a non-selected bitline. When a voltage difference between the selected wordline and the selected bitline of the selected memory cell reaches a programmed voltage threshold of the selected memory cell, the selected memory cell becomes conductive. A second stage of ramping up voltages for the write operation is used if the selected memory cell remains non-conductive during the first stage of ramping up voltages. During the second stage of ramping up voltages for the write operation, the voltage drivers further ramp up voltages, to a third voltage (e.g., 5V), on selected memory cells that remain non-conductive during the first stage of the write operation. To limit the voltage differences applied on non-selected memory cells that are also connected to the voltages being ramped up to the third voltage (e.g., 5V), the circuit patch (e.g., 111) responsible for ramping up to the third voltage (e.g., 5V) communicates with neighboring patches (e.g., 113, 123, 119, 117) and surrounding patches (e.g., 112, 114, 116, 118, 121, 122) to cause the neighboring patches (e.g., 113, 123, 119, 117) and surrounding patches (e.g., 112, 114, 116, 118, 121, 122) to drive the offset voltage on non-selected lines. The offset voltage cancels/offsets at least in part the increased voltage driven by the circuit patch (e.g., 111) on non-selected memory cells that are driven in part by the neighboring patches (e.g., 113, 123, 119, 117) and surrounding patches (e.g., 112, 114, 116, 118, 121, 122).

Circuit patches on the integrated circuit die, including the circuit patch (101), the neighboring patches (103), and the surrounding patches (105), can be arranged in a grid array (e.g., as illustrated in FIGS. 6-9). In the grid array, each row of wordline patches are interleaved with bitline patches, and each column of bitline patches are interleaved with wordline patches.

Preferably, the neighboring patches (e.g., 103; or 113, 115, 117, 119) are immediately adjacent to the circuit patch (e.g., 101; or 111) in the grid array in a column and a row in which the circuit patch (e.g., 101; or 111) is located. Thus, the first connections (123) can be routed on the integrated circuit die without crossing a column of circuit patches, or a row of circuit patches in the grid array.

Preferably, the surrounding patches (e.g., 102; or 112, 114, 116, 118, 121, 122) are closest to that neighboring patches (e.g., 103; or 113, 115, 117, 119) such that the second connections (125) can be routed on the integrated circuit die without crossing more than one column of circuit patches, or more than on row of circuit patches in the grid array.

Preferably, each of the neighboring patches (e.g., 113, 115, 117, 117, 119) is connected to no more than two of the surrounding patches (e.g., 112, 114, 116, 118, 121, 122) via the second connections (125).

Optionally, each of the surrounding patches (e.g., 105; or 112, 114, 116, 118, 121, 122) is connected via no more than one of the second connections (125) to no more than one of the neighboring patches (e.g., 103; or 113, 115, 117, 117, 119).

The present disclosure includes methods and apparatuses which perform the methods described above, including data processing systems which perform these methods, and computer readable media containing instructions which when executed on data processing systems cause the systems to perform these methods.

The memory device of FIG. 4 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An integrated circuit memory device, comprising:
   memory cells;
   a circuit patch configured on an integrated circuit die;
   a plurality of neighboring patches configured on the integrated circuit die;
   first connections from the circuit patch to the neighboring patches respectively, wherein the circuit patch is configured to communicate with the neighboring patches, through the first connections, in determining whether or not to apply an offset voltage on non-selected memory cells by voltage drivers in the neighboring patches during ramping up voltages on one or more selected memory cells driven by voltage drivers in the circuit patch;
   a plurality of surrounding patches configured on the integrated circuit die; and
   second connections from the neighboring patches to the surrounding patches, wherein the circuit patch is configured to communicate with the surrounding patches, through the first connections, the neighboring patches, and the second connections, in determining whether or not to apply the offset voltage on non-selected memory cells by voltage drivers in the surrounding patches during the ramping up of the voltages on the one or more selected memory cells driven by the voltage drivers in the circuit patch.

2. The integrated circuit memory device of claim 1, wherein circuit patches, including the circuit patch, the neighboring patches, and the surrounding patches, are arranged on the integrated circuit die in a grid array; and the neighboring patches are immediately adjacent to the circuit patch in the grid array in a column and a row in which the circuit patch is located.

3. The integrated circuit memory device of claim 2, wherein circuit patches include bitline patches configured to drive bitlines and wordline patches configured to drive wordlines.

4. The integrated circuit memory device of claim 3, wherein the circuit patch is a wordline patch; and the neighboring patches are bitline patches.

5. The integrated circuit memory device of claim 4, wherein the surrounding patches are bitline patches.

6. The integrated circuit memory device of claim 5, wherein in the grid array, each row of wordline patches are interleaved with bitline patches, and each column of bitline patches are interleaved with wordline patches.

7. The integrated circuit memory device of claim 3, wherein the circuit patch is a bitline patch; and the neighboring patches and the surrounding patches are wordline patches.

8. The integrated circuit memory device of claim 3, wherein each of the neighboring patches is connected to no more than two of the surrounding patches via the second connections.

9. The integrated circuit memory device of claim 3, wherein the circuit patch is of a first type; and the neighboring patches and the surrounding patches are of a second type; and the first type and the second type are different ones of: wordline patch and bitline patch.

10. The integrated circuit memory device of claim 9, wherein in the grid array, no patches of the second type are closer to the circuit patch than the surrounding patches.

11. The integrated circuit memory device of claim 10, wherein the surrounding patches include no more than ten patches; and each of the second connections connects from one of the neighboring patches to one of the surrounding patches.

12. A method, comprising:
connecting, via first connections on an integrated circuit die from a circuit patch to neighboring patches respectively;
communicating, between the circuit patch and the neighboring patches through the first connections, in determining whether or not to apply an offset voltage on non-selected memory cells by voltage drivers in the neighboring patches during ramping up voltages on one or more selected memory cells driven by voltage drivers in the circuit patch;
connecting, via second connections on the integrated circuit die from the neighboring patches to surrounding patches configured on the integrated circuit die; and
communicating, between the circuit patch and the surrounding patches through the first connections, the neighboring patches, and the second connections, in determining whether or not to apply the offset voltage on non-selected memory cells by voltage drivers in the surrounding patches during the ramping up of the voltages on the one or more selected memory cells driven by the voltage drivers in the circuit patch.

13. The method of claim 12, wherein the circuit patch is of a first type; the neighboring patches and the surrounding patches are of a second type; and the first and second types are different ones of: wordline patch and bitline patch.

14. The method of claim 13, further comprising:
during a first stage of ramping up voltages for a write operation,
ramping up voltages on selected bitlines in the integrated circuit die to a first predetermined voltage of a first polarity;
ramping up voltages on selected wordlines in the integrated circuit die to the first predetermined voltage of a second polarity opposite to the first polarity; and
holding voltages on non-selected bitlines and wordlines in the integrated circuit die to a second predetermined voltage;
determining whether a memory cell connected to a selected bitline and a selected wordline is conductive under voltages applied to the selected bitline and the selected wordline during the first stage of the write operation, and
in response to a determination that the memory cell is not conductive under voltages applied to the selected bitline and the selected wordline during the first stage of the write operation, performing a second stage of ramping up voltages for the write operation, including:
ramping up a voltage applied by the circuit patch on the memory cell to a third predetermined voltage, and
selectively driving the offset voltage by the neighboring patches and the surrounding patches based on the communicating between the circuit patch and the neighboring patches and the communicating between the circuit patch and the surrounding patches.

15. The method of claim 14, wherein the offset voltage offsets at least in part a voltage increase, caused by the ramping up of the voltage applied by the circuit patch on the memory cell to the third predetermined voltage, in a voltage difference applied on a non-selected memory cell that is subjected to the voltage applied by the circuit patch on the memory cell and ramped up to the third predetermined voltage.

16. The method of claim 15, wherein the memory cell becomes conductive when a voltage difference between the selected bitline and the selected wordline is above a threshold voltage of the memory cell.

17. A memory device, comprising:
a controller;
a first set of parallel wordline wires disposed in a first layer of an integrated circuit die;
a second set of parallel bitline wires disposed in a second layer of the integrated circuit die;
a first set of voltage drivers connected to the first set of parallel wires respectively;
a second set of voltage drivers connected to the second set of parallel wires respectively;
an array of memory cells formed between the first layer and the second layer, wherein each respective memory cell is at a cross point of a wordline wire in the first layer and a bitline wire in the second layer; and
circuit patches configured in a grid array in alignment with the wordline wires and bitline wires, wherein circuit patches include wordline patches configured to drive voltages on the wordline wires and bitline patches configured to drive voltages on the bitline wires, and wherein the wordline patches and bitline patches are interleaved in column-wise directions and row-wise directions in the grid array;
wherein a circuit patch is configured to communicate with neighboring patches in determining whether or not to apply an offset voltage on non-selected memory cells by voltage drivers in the neighboring patches during ramping up voltages on one or more selected memory cells driven by voltage drivers in the circuit patch; and
wherein the circuit patch is configured to communicate with the surrounding patches through the neighboring patches in determining whether or not to apply the offset voltage on non-selected memory cells by voltage drivers in the surrounding patches during the ramping up of the voltages on the one or more selected memory cells driven by the voltage drivers in the circuit patch.

18. The memory device of claim 17, wherein the respective memory cell has a select device and no phase-change memory device.

19. The memory device of claim 18, further comprising:
first connections between the circuit patch and the neighboring patches; and
second connections between the neighboring patches and surrounding patches.

20. The memory device of claim 19, wherein each of the neighboring patches are connected to no more than two of the surrounding patches.

* * * * *